(12) United States Patent
Pelella et al.

(10) Patent No.: US 7,494,885 B1
(45) Date of Patent: Feb. 24, 2009

(54) DISPOSABLE SPACER PROCESS FOR FIELD EFFECT TRANSISTOR FABRICATION

(75) Inventors: Mario M. Pelella, Mountain View, CA (US); Darin A. Chan, San Francisco, CA (US); Kei-Leong Ho, Mountain View, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 602 days.

(21) Appl. No.: 10/818,155

(22) Filed: Apr. 5, 2004

(51) Int. Cl.
*H01L 21/00* (2006.01)

(52) U.S. Cl. .................. 438/302; 438/305; 438/306

(58) Field of Classification Search ............... 438/302, 438/305–306
See application file for complete search history.

(56) References Cited

U.S. PATENT DOCUMENTS

| | | | | |
|---|---|---|---|---|
| 6,074,045 | A * | 6/2000 | Bergman et al. | 347/55 |
| 6,475,888 | B1 * | 11/2002 | Sohn | 438/535 |
| 6,559,017 | B1 * | 5/2003 | Brown et al. | 438/302 |
| 6,849,546 | B1 * | 2/2005 | Tu et al. | 438/682 |
| 7,119,017 | B2 * | 10/2006 | Tu et al. | 438/682 |
| 7,211,492 | B2 * | 5/2007 | Forbes et al. | 438/305 |
| 7,214,994 | B2 * | 5/2007 | Forbes et al. | 257/408 |
| 7,393,789 | B2 * | 7/2008 | Abatchev et al. | 438/692 |
| 7,429,536 | B2 * | 9/2008 | Abatchev et al. | 438/725 |
| 2002/0160592 | A1 * | 10/2002 | Sohn | 438/535 |
| 2005/0095856 | A1 * | 5/2005 | Tu et al. | 438/682 |
| 2006/0263699 | A1 * | 11/2006 | Abatchev et al. | 430/5 |
| 2007/0007635 | A1 * | 1/2007 | Forbes et al. | 257/678 |
| 2007/0045676 | A1 * | 3/2007 | Forbes et al. | 257/288 |
| 2007/0045752 | A1 * | 3/2007 | Forbes et al. | 257/387 |
| 2007/0049032 | A1 * | 3/2007 | Abatchev et al. | 438/691 |
| 2007/0164375 | A1 * | 7/2007 | Ohta et al. | 257/408 |
| 2007/0281219 | A1 * | 12/2007 | Sandhu | 430/5 |
| 2008/0182372 | A1 * | 7/2008 | Liu et al. | 438/230 |
| 2008/0254579 | A1 * | 10/2008 | Chi et al. | 438/199 |
| 2008/0261349 | A1 * | 10/2008 | Abatchev et al. | 438/106 |
| 2008/0290527 | A1 * | 11/2008 | Abatchev et al. | 257/774 |

* cited by examiner

*Primary Examiner*—Laura M Menz
(74) *Attorney, Agent, or Firm*—Farjami & Farjami LLP (57) ABSTRACT

According to one exemplary embodiment, a method for forming a field effect transistor on a substrate comprises a step of forming disposable spacers adjacent to a gate stack situated on the substrate, where the disposable spacers comprise amorphous carbon. The disposable spacers can be formed by depositing a layer of amorphous carbon on the gate stack and anisotropically etching the layer of amorphous carbon. The method further comprises forming source and drain regions in the substrate, where the source and drain regions are situated adjacent to the disposable spacers. According to this exemplary embodiment, the method further comprises removing the disposable spacers, where the removal of the disposable spacers causes substantially no gouging in the substrate. The disposable spacers can be removed by using a dry etch process. The method can further comprise forming extension regions in the substrate adjacent to the gate stack prior to forming the disposable spacers.

7 Claims, 11 Drawing Sheets

DISPOSABLE SPACER PROCESS FOR FIELD EFFECT TRANSISTOR FABRICATION

TECHNICAL FIELD

The present invention is generally in the field of semiconductor devices. More particularly, the present invention is in the field of fabrication of field effect transistors.

BACKGROUND ART

A field effect transistor (FET), such as an NFET or a PFET, typically includes shallow, lightly doped extension regions situated in a silicon substrate adjacent to a channel region, which is situated under a stacked gate structure. The FET further includes deep, heavily doped source and drain regions, which are situated under the extension regions and also situated a certain distance away from the channel region in the silicon substrate. However, the distance between the source and drain regions and the channel region must be sufficient to prevent the heavily doped source and drain regions from over-running the lightly doped extension regions and causing undesirable short channel effects in the FET.

During FET fabrication, a desired distance between the channel region and the source and drain regions can be maintained by forming disposable spacers adjacent to the sidewalls of a stacked gate structure prior to formation of the source and drain regions. During a conventional disposable spacer process, a oxide liner is generally formed over the stacked gate structure and on the silicon substrate adjacent to the stacked gate structure. Conventional disposable spacers, which typically comprise oxide or nitride, are then formed on the oxide liner adjacent to the sidewalls of the stacked gate structure and over the extension regions. After source and drain regions have been implanted, the conventional disposable spacers and oxide liner are removed by using an HF wet etch process. However, as a result of low selectivity between oxide and silicon, during removal of the conventional disposable spacers and oxide liner in the HF wet etch process, undesirable gouging can occur in the extension regions in the silicon substrate. Dopant loss that results from gouging in the extension regions can increase the resistance of the extension regions, which can cause a decrease in FET performance.

Thus, there is a need in the art for a disposable spacer process that provides disposable spacers that can be effectively removed during FET fabrication without causing gouging or dopant loss in the substrate.

SUMMARY

The present invention is directed to disposable spacer process for field effect transistor fabrication. The present invention addresses and resolves the need in the art for a disposable spacer process that provides disposable spacers that can be effectively removed during field effect transistor fabrication without causing gouging or dopant loss in the substrate.

According to one exemplary embodiment, a method for forming a field effect transistor on a substrate comprises a step of forming disposable spacers adjacent to a gate stack situated on the substrate, where the disposable spacers comprise amorphous carbon. The disposable spacers can be formed by depositing a layer of amorphous carbon on the gate stack and on the substrate adjacent to the gate stack and anisotropically etching the layer of amorphous carbon. The disposable spacers can have a width of approximately 70.0 Angstroms, for example. The method further comprises forming source and drain regions in the substrate, where the source and drain regions are situated adjacent to the disposable spacers.

According to this exemplary embodiment, the method further comprises removing the disposable spacers, where the removal of the disposable spacers causes substantially no gouging in the substrate. The disposable spacers can be removed by using a dry etch process, such as an oxygen plasma strip. The method can further comprise forming extension regions in the substrate adjacent to the gate stack prior to forming the disposable spacers. The method can further comprise forming a silicide layer on the substrate, where the silicide layer is situated adjacent to the gate stack. Other features and advantages of the present invention will become more readily apparent to those of ordinary skill in the art after reviewing the following detailed description and accompanying drawings.

DETAILED DESCRIPTION OF THE INVENTION

The present invention is directed to disposable spacer process for field effect transistor fabrication. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
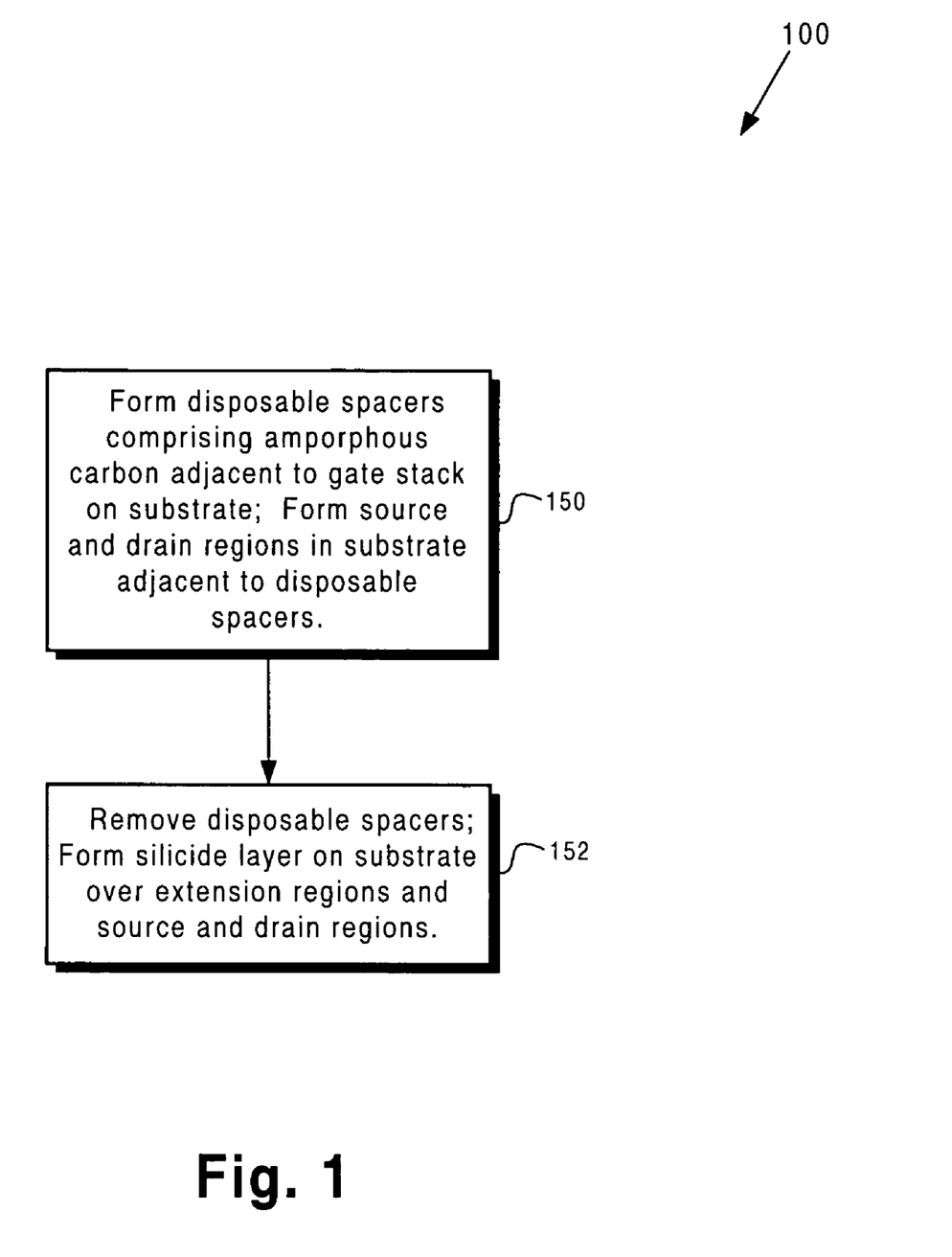
FIG. 1 is a flowchart corresponding to exemplary method steps according to one embodiment of the present invention.

FIG. 1 shows a flowchart illustrating an exemplary method for forming and removing disposable spacers during fabrication of a field effect transistor according to one embodiment of the present invention. Certain details and features have been left out of flowchart 100 that are apparent to a person of ordinary skill in the art. For example, a step may consist of one or more substeps or may involve specialized equipment or materials, as known in the art. Steps 150 and 152 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 150, includes a gate stack situated on a silicon substrate and extension regions situated in the substrate adjacent to the gate stack. Structures 250 and 252 in FIGS. 2A and 2B illustrate the result of performing, on a structure including a gate stack situated on a silicon substrate discussed above, steps 150 and 152 of flowchart 100, respectively.

Figure 2A:
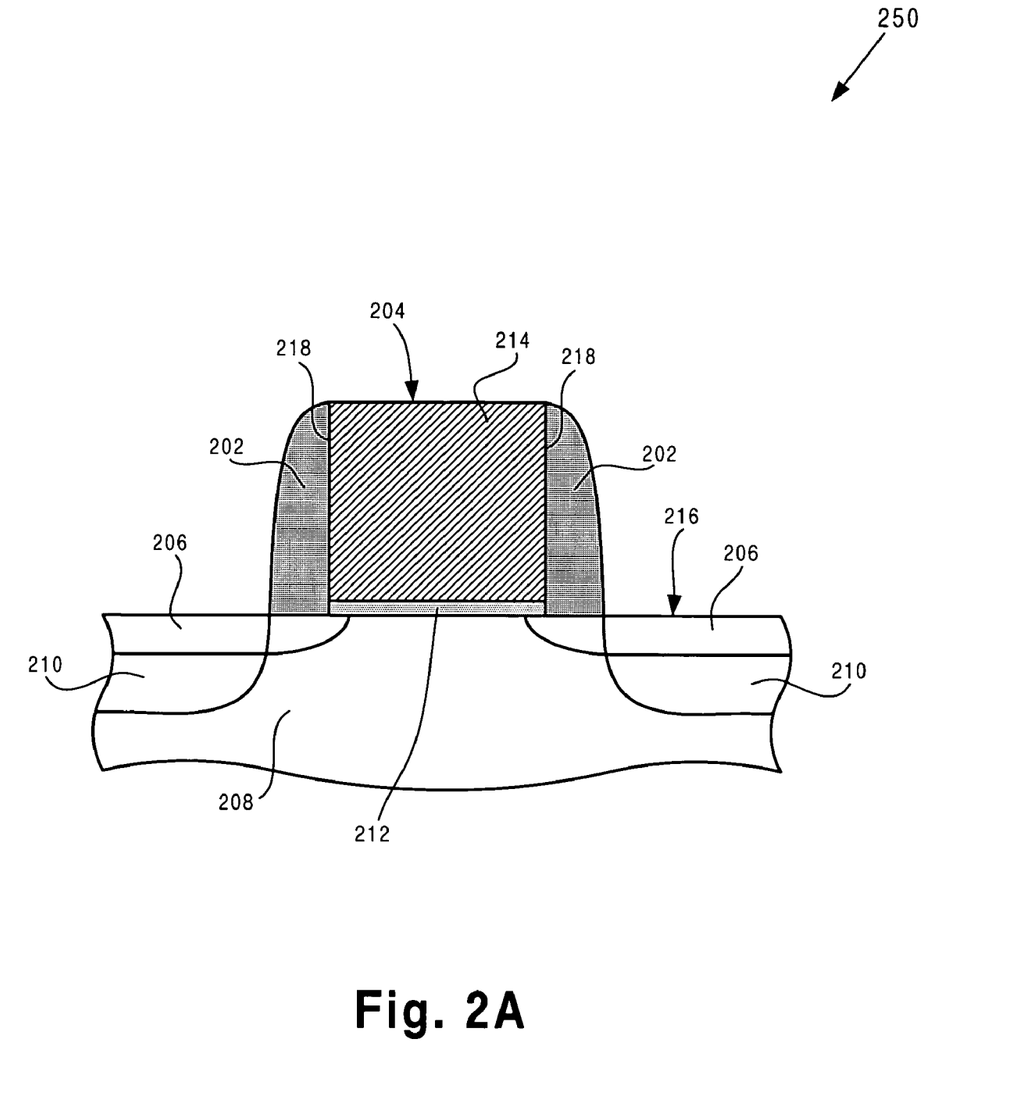
FIG. 2A illustrates a cross-sectional view of a portion of a wafer processed according to an embodiment of the invention, corresponding to certain steps of the flowchart in FIG. 1.

Referring now to step 150 in FIG. 1 and structure 250 in FIG. 2A, at step 150 of flowchart 100, disposable spacers 202 are formed adjacent to gate stack 204 and over extension regions 206 in substrate 208 and source and drain regions 210 are formed in substrate 208 adjacent to disposable spacers 202. Gate stack 204 includes gate dielectric layer 212 and gate electrode 214. As shown in FIG. 2A, gate dielectric layer 212 is situated on top surface 216 of substrate 208 and can comprise silicon dioxide or other appropriate dielectric material. Gate dielectric layer 212 can be formed on substrate 208 by thermally growth or by chemical vapor deposition (CVD) process or other appropriate processes. Also shown in FIG. 2A, gate electrode 214 is situated on gate dielectric layer 212 and can comprise polycrystalline silicon or other appropriate conductive material, such as metal. Gate electrode 214 can be formed on gate dielectric layer 212 by CVD process or other appropriate processes.

Further shown in FIG. 2A, extension regions 206 are situated in substrate 208 adjacent to sidewall regions 218 of gate stack 204. Extension regions 206 are lightly doped regions, which can be formed prior to disposable spacers 202 by using a shallow ion implantation process using a low ion dose. Sidewall regions 218 comprise an insulator such as silicon oxide and can have a thickness of between approximately 25.0 Angstroms and approximately 100.0 Angstroms. Also shown in FIG. 2A, disposable spacers 202 are situated adjacent to sidewall regions 218 of gate stack 204 and comprise amorphous carbon. Disposable spacers 202 can be formed by depositing a layer of amorphous carbon over gate stack 204 and over extension regions 206 in substrate 208. The layer of amorphous carbon can then be anisotropically etched to form disposable spacers 202 adjacent to sidewall regions 218 of gate stack 204 and over extension regions 206. By way of example, disposable spacers 202 can have a width of approximately 70.0 Angstroms. Further shown in FIG. 2A, source and drain regions 210 are situated adjacent to disposable spacers 202 in substrate 208. Source and drain regions 210 are heavily doped regions, which can be formed by using a deep ion implantation process using a high ion dose. Referring to FIG. 2A, the result of step 150 of flowchart 100 is illustrated by structure 250.

Figure 2B:
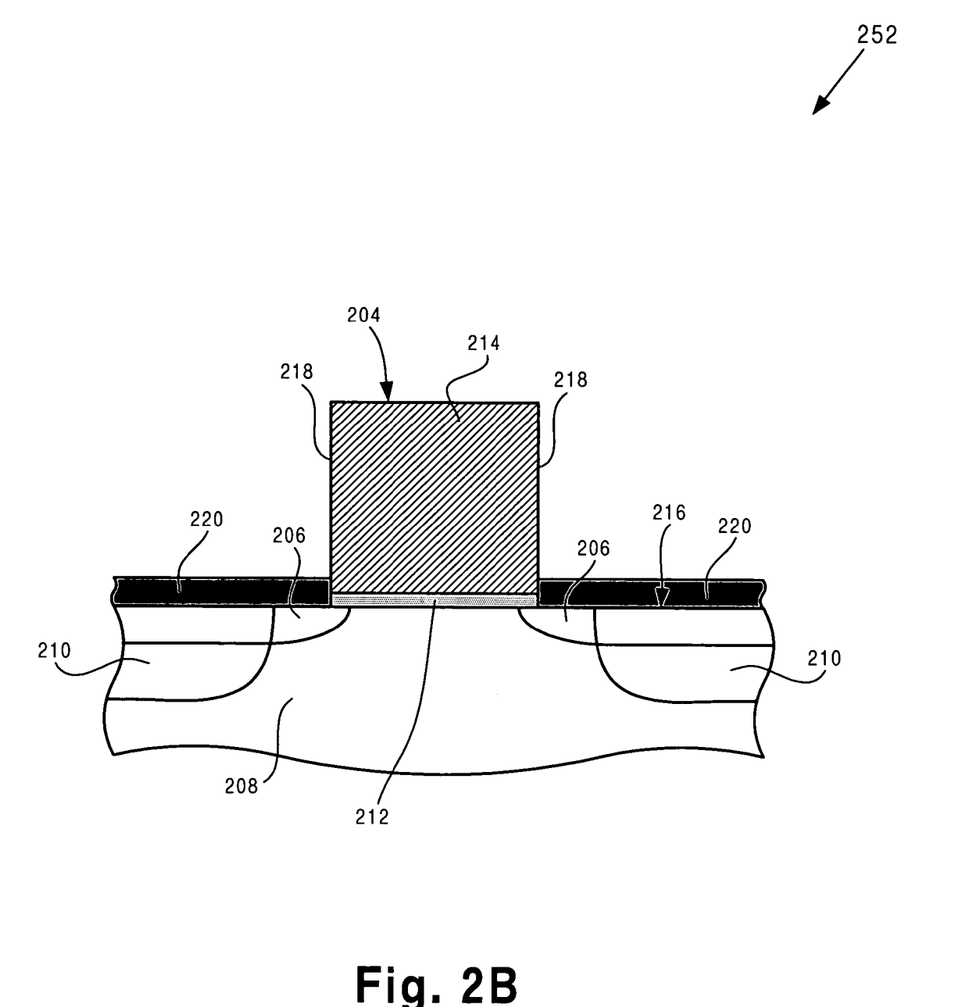
FIG. 2B illustrates a cross-sectional view of a portion of a wafer processed according to an embodiment of the invention, corresponding to certain steps of the flowchart in FIG. 1.

Continuing with step 152 in FIG. 1 and structure 252 in FIG. 2B, at step 152 of flowchart 100, disposable spacers 202 are removed and silicide layer 220 is formed on substrate 208 over extension regions 206 and source and drain regions 210. Disposable spacers 202 in FIG. 2A can be removed by using a dry etch process, such as an oxygen ($O_2$) plasma strip, which has a very high selectivity with respect to silicon. As a result, the removal of disposable spacers 202 in the dry etch process causes substantially no gouging in extension regions 206 of the silicon substrate, i.e. substrate 208. Also, the embodiment of the present invention in FIG. 1 avoids dopant loss in extension regions 206 that accompanies gouging. Moreover, disposable spacers 202 can be removed during removal of a resist mask (not shown in any of the figures) that is typically formed over substrate 208 prior to formation of disposable spacers 202, which advantageously saves additional processing.

In contrast, a conventional spacer process generally utilizes a thin oxide liner and a wide spacer. However, since there is low selectivity between oxide and silicon, the oxide liner and spacer are difficult to remove without causing gouging of the silicon substrate and dopant loss in the extension regions of the substrate. Furthermore, the oxide liner in the conventional spacer process is generally formed in a thermal process, which causes dopant to be segregated out of the extension regions. Thus, by not requiring an oxide liner to be formed between the disposable spacer and the substrate, the embodiment of the present invention in FIG. 1 advantageously avoids undesirable dopant segregation that occurs during oxide liner formation.

Also shown in FIG. 2B, silicide layer 220 is situated on substrate 208 over extension regions 206 and source and drain regions 210. Silicide layer 220 can be formed on substrate 208 over extension regions 206 and source and drain regions 210 in a manner known in the art. Silicide layer 220 is utilized to significantly lower parasitic resistance and thus increase overall FET performance. Referring to FIG. 2B, the result of step 152 of flowchart 100 is illustrated by structure 252.

Thus, in the embodiment of the present invention in FIG. 1, by forming disposable spacers comprising amorphous carbon, the present invention provides disposable spacers that can be easily removed by using a high selectivity plasma etch process while causing substantially no gouging or dopant loss in extension regions of the substrate.

Figure 3:
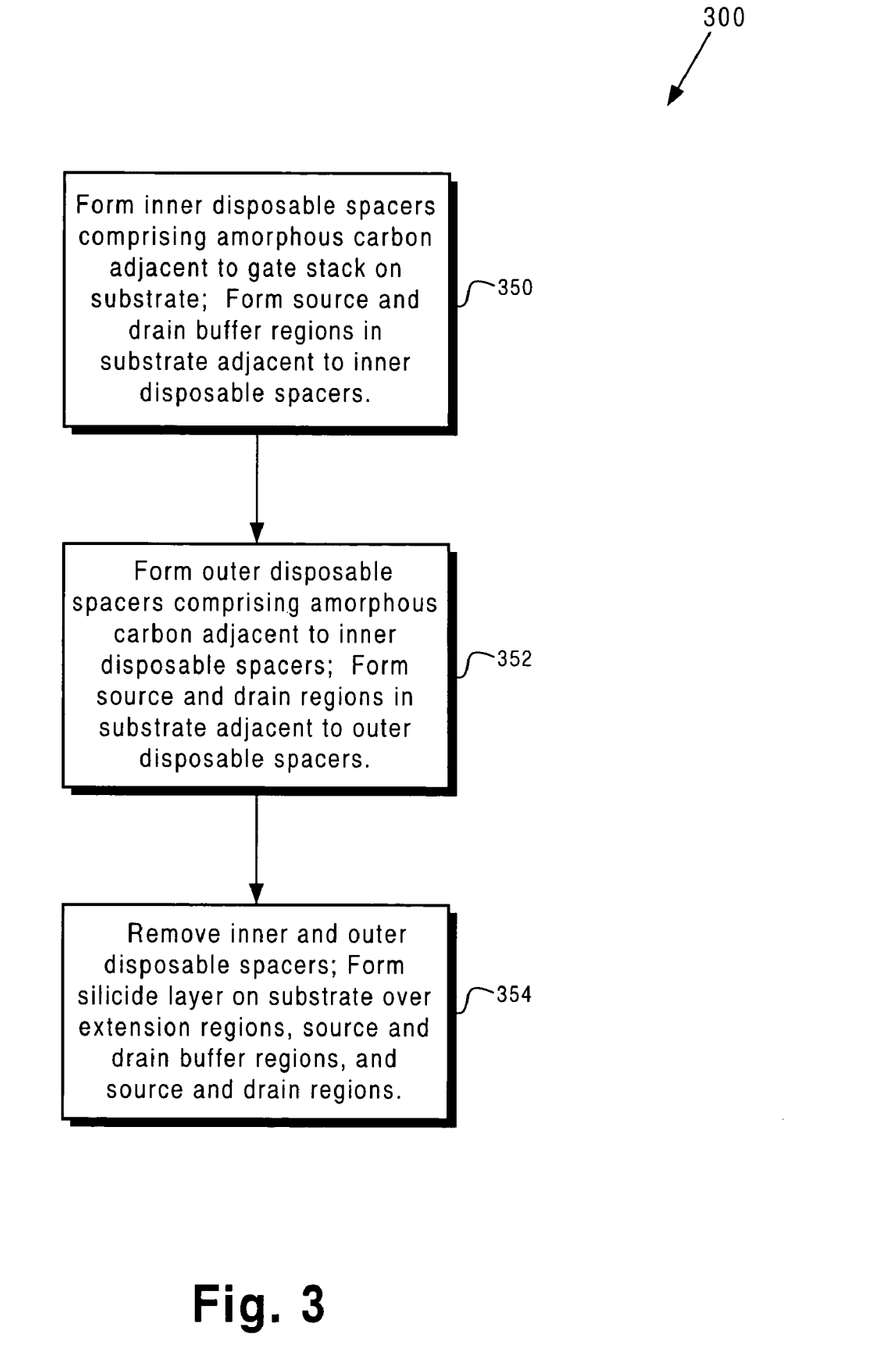
FIG. 3 is a flowchart corresponding to exemplary method steps according to one embodiment of the present invention.

FIG. 3 shows a flowchart illustrating an exemplary method for forming and removing disposable spacers during fabrication of a field effect transistor according to one embodiment of the present invention. Certain details and features have been left out of flowchart 300 that are apparent to a person of ordinary skill in the art. For example, a step may consist of one or more substeps or may involve specialized equipment or materials, as known in the art. Steps 350, 352, and 354 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 350, includes a gate stack situated on a silicon substrate and extension regions situated in the substrate adjacent to the gate stack. Structures 450, 452, and 454 in FIGS. 4A, 4B, and 4C illustrate the result of performing, on a structure including a gate stack situated on a silicon substrate discussed above, steps 350, 352, and 354 of flowchart 300, respectively.

Figure 4A:
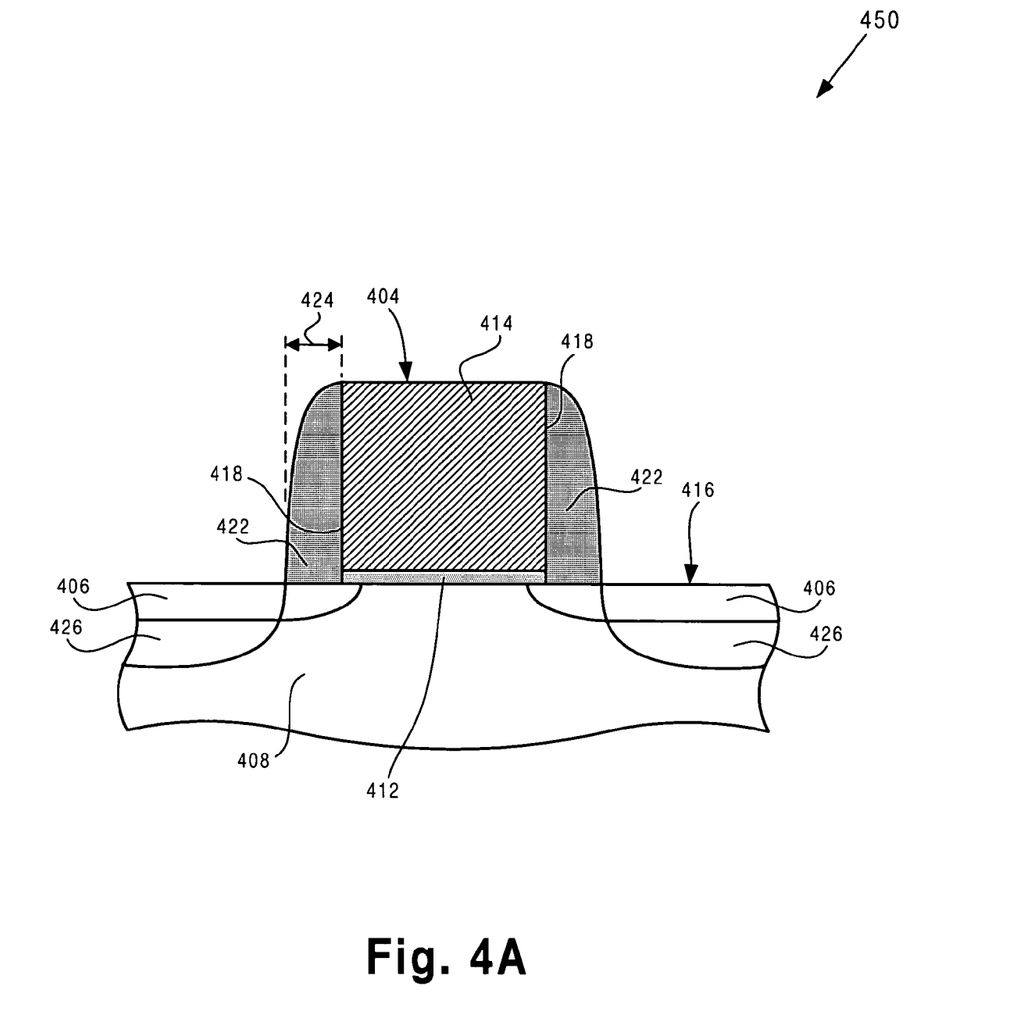
FIG. 4A illustrates a cross-sectional view of a portion of a wafer processed according to an embodiment of the invention, corresponding to certain steps of the flowchart in FIG. 3.

Referring now to step 350 in FIG. 3 and structure 450 in FIG. 4A, at step 350 of flowchart 300, inner disposable spacers 422 are formed adjacent to gate stack 404 on substrate 408 and source and drain buffer regions 426 are formed in substrate 408 adjacent to inner disposable spacers 422. In FIG. 4A, gate stack 404, extension regions 406, substrate 408, gate dielectric layer 412, gate electrode 414, top surface 416, and sidewall regions 418 in structure 450 correspond, respectively, to gate stack 204, extension regions 206, substrate 208, gate dielectric layer 212, gate electrode 214, top surface 216, and sidewall regions 218 in structure 250 in FIG. 2A. Specifically with respect to sidewall regions 418, it is noted that they (i.e. sidewall regions 418) comprise an insulator such as silicon oxide and can have a thickness of between approximately 25.0 Angstroms and approximately 100.0 Angstroms.

As shown in FIG. 4A, extension regions 406 are situated in substrate 408 adjacent to gate stack 414. In the present embodiment, extension regions 406 are formed prior to formation of inner disposable spacers 422. In one embodiment, extension regions 406 can be formed in substrate 408 after inner disposable spacers 422 have been removed in a subsequent process step. Also shown in FIG. 4A, inner disposable spacers 422 are situated adjacent to sidewall regions 418 of gate stack 404 and comprise amorphous carbon. Inner disposable spacers 422 can be formed in a similar manner as disposable spacers 202 in FIG. 2A and have width 424, which can be approximately 70.0 Angstroms. Further shown in FIG. 4A, source and drain buffer regions 426 are situated in substrate 408 adjacent to inner disposable spacers 422 and under extension regions 426. Source and drain buffer regions 426 are heavily doped regions, which can be formed by using a deep ion implantation process using a high ion dose. Referring to FIG. 4A, the result of step 350 of flowchart 300 is illustrated by structure 450.

Figure 4B:
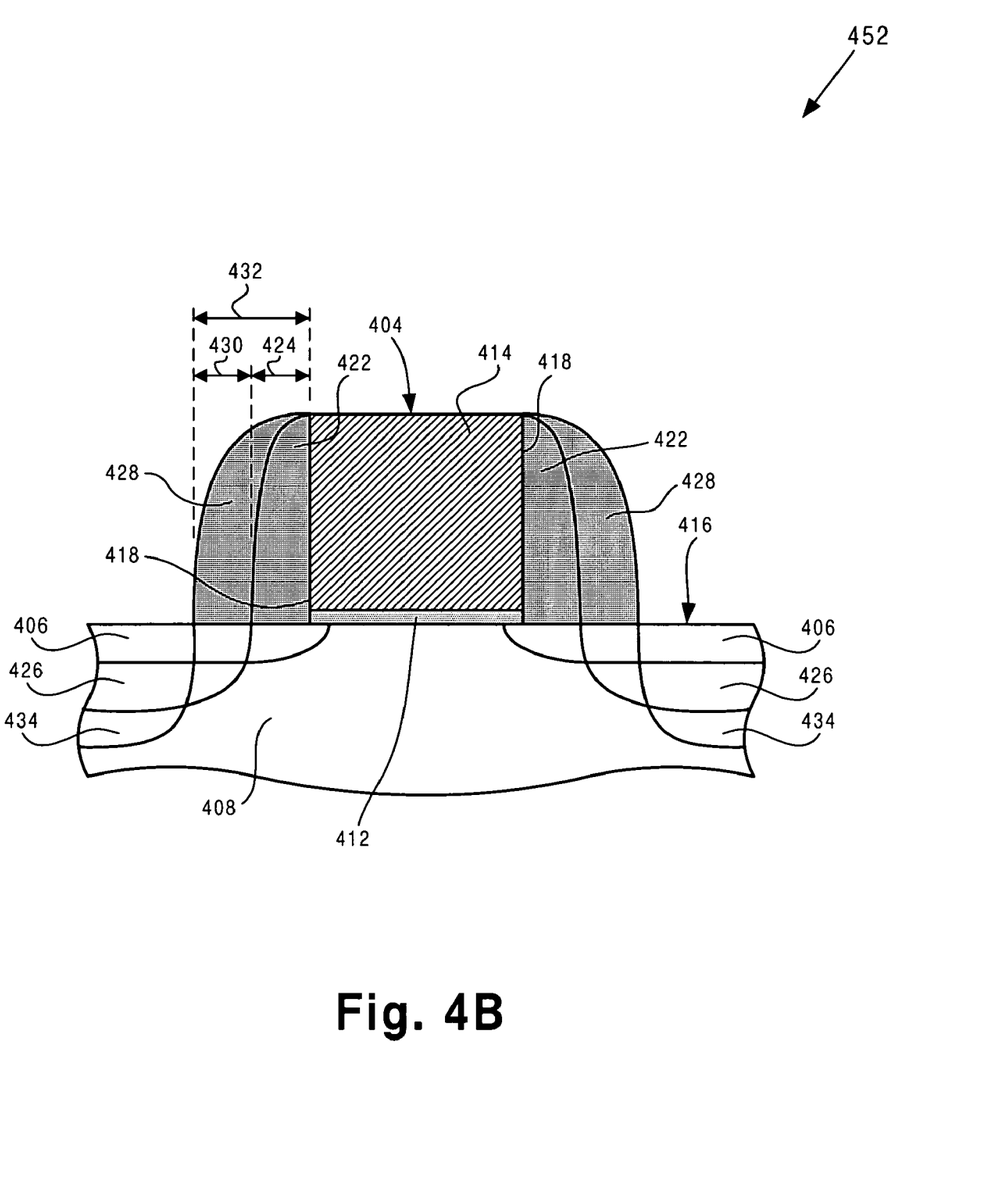
FIG. 4B illustrates a cross-sectional view of a portion of a wafer processed according to an embodiment of the invention, corresponding to certain steps of the flowchart in FIG. 3.
Figure 4C:
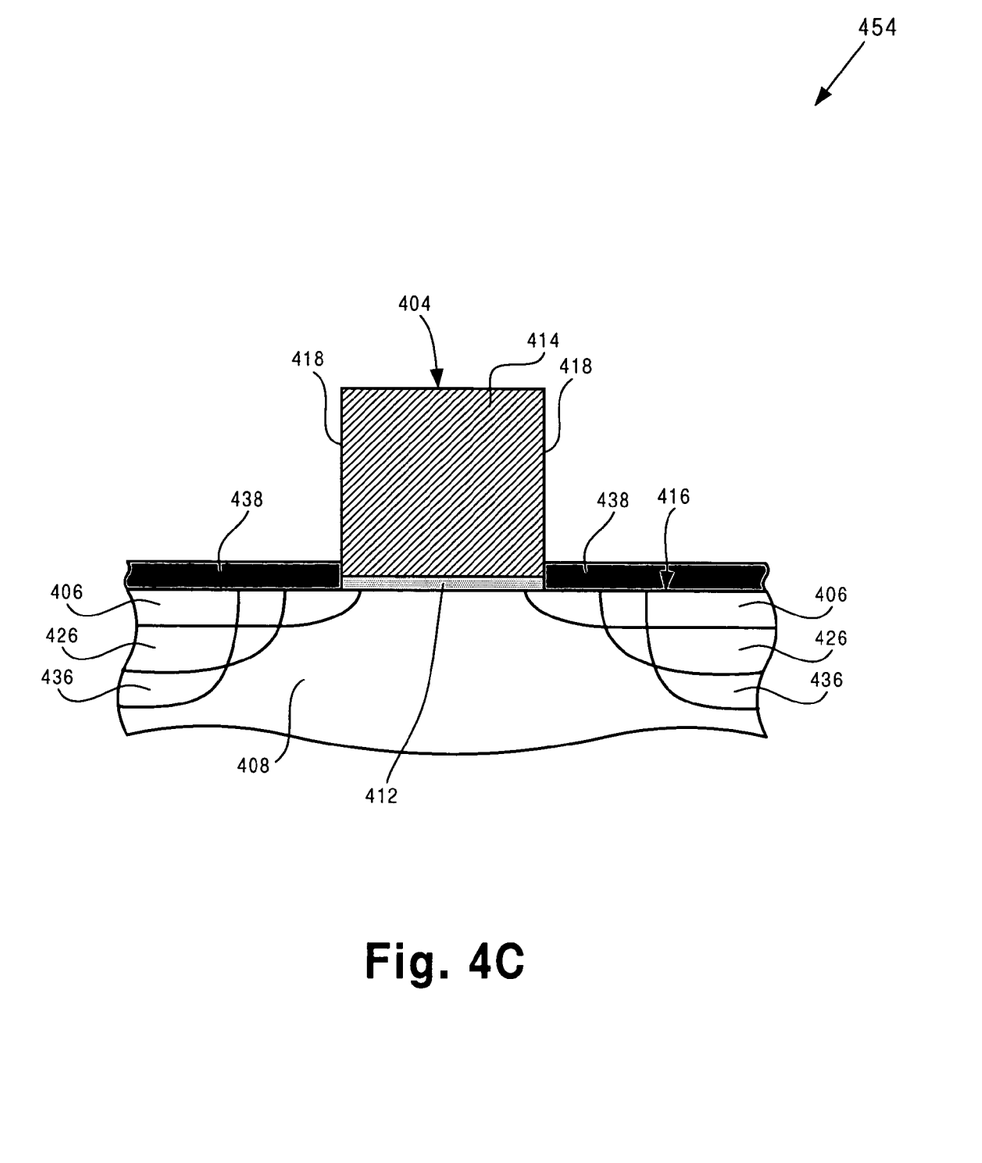
FIG. 4C illustrates a cross-sectional view of a portion of a wafer processed according to an embodiment of the invention, corresponding to certain steps of the flowchart in FIG. 3.

Continuing with step 352 in FIG. 3 and structure 452 in FIG. 4B, at step 352 of flowchart 300, outer disposable spacers 428 are formed adjacent to inner disposable spacers 422 and source and drain regions 434 are formed in substrate 408 adjacent to outer disposable spacers 428. As shown in FIG. 4B, outer disposable spacers 428 are situated adjacent to inner disposable spacers 422 on top surface 416 of substrate 408 and also comprise amorphous carbon. Outer disposable spacers 428 can be formed by depositing a layer of amorphous carbon over gate stack 404, inner disposable spacers 422, and substrate 408 and anisotropically etching the layer of amorphous carbon. Outer disposable spacers 428 have width 430, which can be approximately 70.0 Angstroms, for example. Inner and outer disposable spacers 422 and 428 form a "multilayer" disposable spacer having width 432, which is equal to the sum of width 424 and width 430.

By combining inner and outer disposable spacers 422 and 428, the present embodiment achieves a multilayer disposable spacer having greater step coverage than a single disposable spacer, such as disposable spacer 202 in FIG. 2A. In another embodiment, the aforementioned sequence of inner and outer disposable spacer formation may be repeated as many times as required to achieve a multilayer disposable spacer having a desired width. Also shown in FIG. 4B, source and drain regions 434 are situated in substrate 408 adjacent to outer disposable spacer 428 and under source and drain buffer regions 426. Source and drain regions 434 are heavily doped regions, which can be formed by using a deep ion implantation process using a high ion dose. Referring to FIG. 4B, the result of step 352 of flowchart 300 is illustrated by structure 452.

Continuing with step 354 in FIG. 3 and structure 454 in FIG. 4C, at step 354 of flowchart 300, inner and outer disposable spacers 422 and 428 are removed and silicide layer 438 is formed over extension regions 406, source and drain buffer regions 426, and source and drain regions 434. Inner and outer disposable spacers 422 and 428 in FIG. 4B can be removed by using a dry etch process, such as an $O_2$ plasma strip, which has a very high selectivity with respect to silicon. As a result, the removal of inner and outer disposable spacers 422 and 428 causes substantially no gouging or dopant loss in extension regions 406 of substrate 408. In one embodiment, extension regions 406 can be formed in substrate 408 adjacent to gate stack 404 after removal of inner and outer disposable spacers 422 and 428. Also shown in FIG. 4C, silicide layer 438 is situated on substrate 408 adjacent to gate stack 404. Silicide layer 438 can be formed in a similar manner and provides similar advantages as silicide layer 220 in FIG. 2B. Referring to FIG. 4C, the result of step 354 of flowchart 300 is illustrated by structure 454.

Thus, the embodiment of the present invention in FIG. 3 achieves similar advantages as the embodiment of the present invention in FIG. 1. Additionally, the embodiment of the present invention in FIG. 3 advantageously achieves a graded source and drain profile by forming source and drain buffer regions after formation of inner disposable spacers. In another embodiment, the cycle of forming inner disposable spacers, forming source and drain buffer regions, and forming outer disposable spacers can be repeated as many times as required to achieve a desire source and drain graded doping profile. Furthermore, the embodiment of the present invention in FIG. 3 advantageously achieves a multilayer disposable spacer having an increased width.

Figure 5:
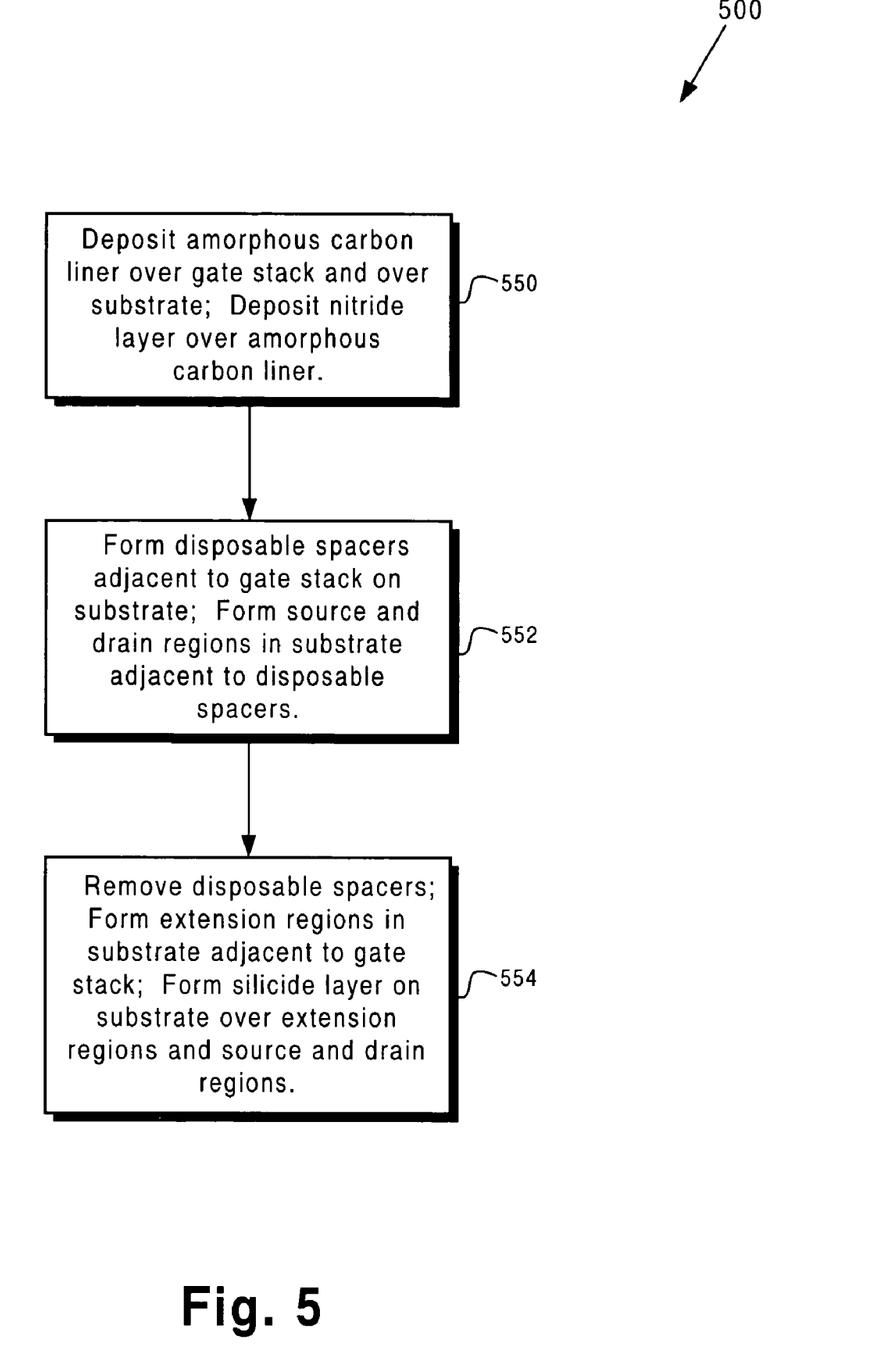
FIG. 5 is a flowchart corresponding to exemplary method steps according to one embodiment of the present invention.

FIG. 5 shows a flowchart illustrating an exemplary method for forming and removing disposable spacers during fabrication of a field effect transistor according to one embodiment of the present invention. Certain details and features have been left out of flowchart 500 that are apparent to a person of ordinary skill in the art. For example, a step may consist of one or more substeps or may involve specialized equipment or materials, as known in the art. Steps 550, 552, and 554 indicated in flowchart 300 are sufficient to describe one embodiment of the present invention, other embodiments of the invention may utilize steps different from those shown in flowchart 500. It is noted that the processing steps shown in flowchart 500 are performed on a wafer, which, prior to step 550, includes a gate stack situated on a silicon substrate. Structures 650, 652, and 654 in FIGS. 6A, 6B, and 6C illustrate the result of performing, on a structure including a gate stack situated on a silicon substrate discussed above, steps 550, 552, and 554 of flowchart 500, respectively.

Figure 6A:
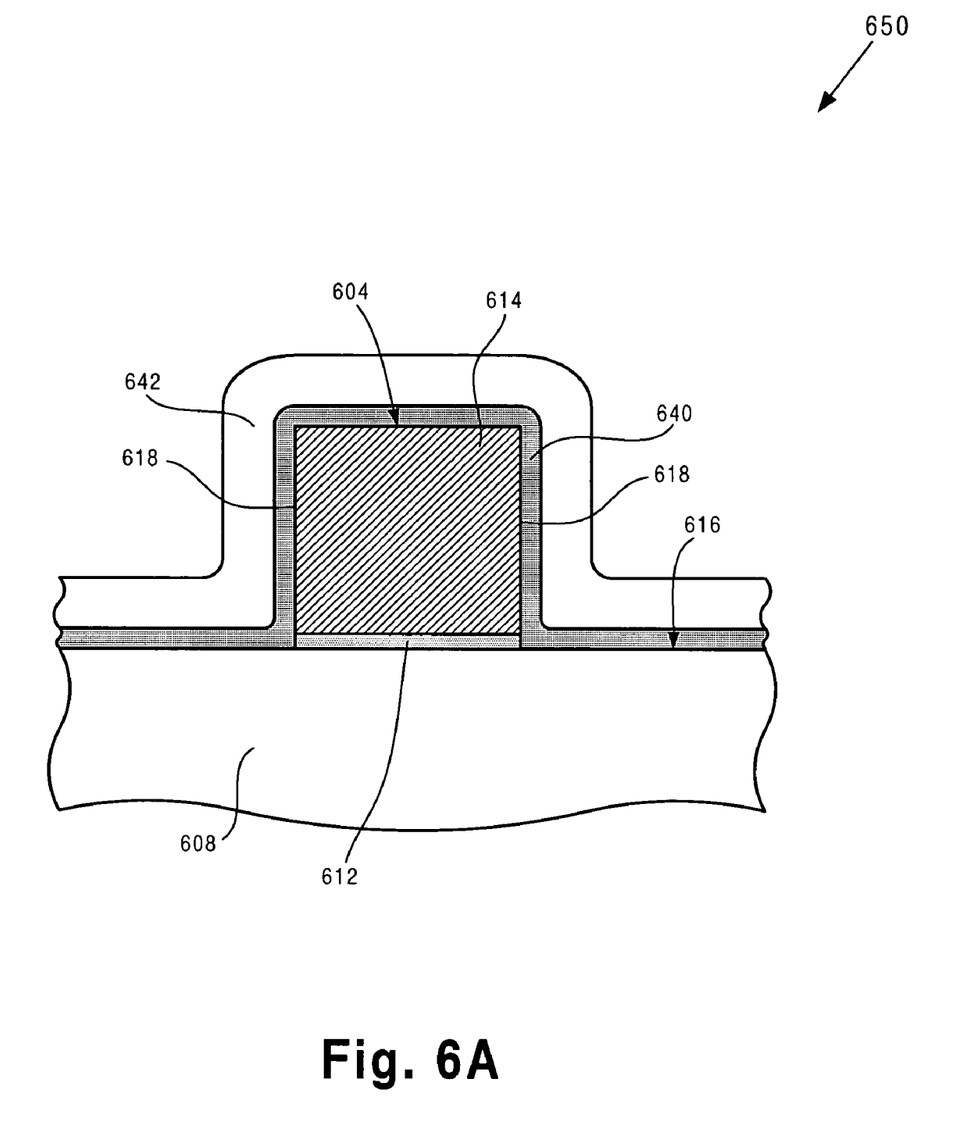
FIG. 6A illustrates a cross-sectional view of a portion of a wafer processed according to an embodiment of the invention, corresponding to certain steps of the flowchart in FIG. 5.

Referring now to step 550 in FIG. 5 and structure 650 in FIG. 6A, at step 550 of flowchart 500, liner 640 is deposited over gate stack 604, on sidewall regions 618 of gate stack 604, and over top surface 616 of substrate 608 and nitride layer 642 is deposited over liner 640. In FIG. 6A, gate stack 604, substrate 608, gate dielectric layer 612, gate electrode 614, top surface 616, and sidewall regions 618 in structure 650 correspond, respectively, to gate stack 204, substrate 208, gate dielectric layer 212, gate electrode 214, top surface 216, and sidewall regions 218 in structure 250 in FIG. 2A. Specifically with respect to sidewall regions 618, it is noted that they (i.e. sidewall regions 618) comprise an insulator such as silicon oxide and can have a thickness of between approximately 25.0 Angstroms and approximately 100.0 Angstroms.

As shown in FIG. 6A, liner 640 is situated over gate stack 604, on sidewall regions 618 of gate stack, and over top surface 616 of substrate 608. Liner 640 comprises amorphous carbon and can be deposited by a CVD process or other appropriate processes. Also shown in FIG. 6A, nitride layer 642 is situated over liner 640 and can comprise silicon nitride. Nitride layer 642 can be deposited on liner 640 by a CVD process or other appropriate processes. Referring to FIG. 6A, the result of step 550 of flowchart 500 is illustrated by structure 650.

Figure 6B:
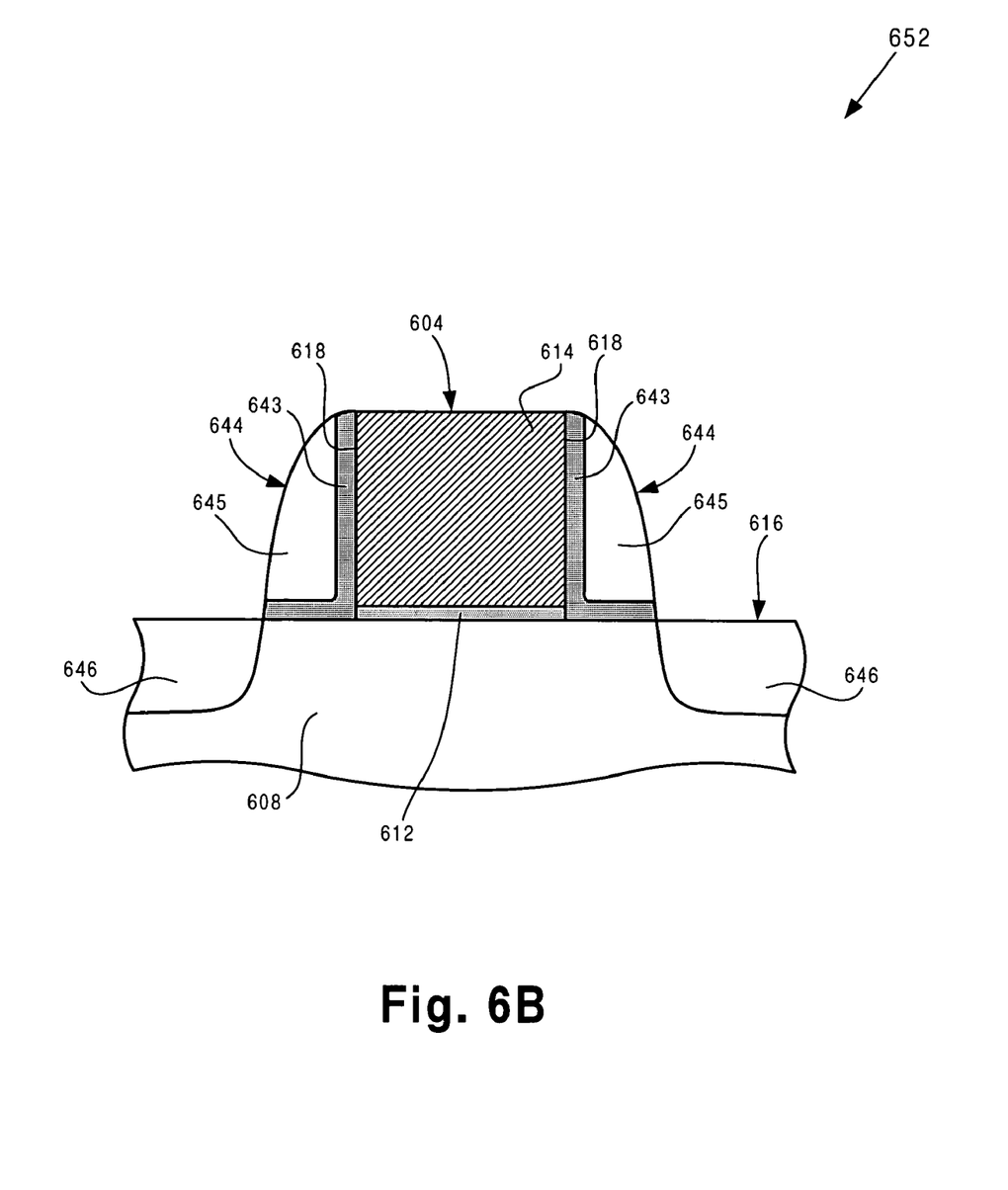
FIG. 6B illustrates a cross-sectional view of a portion of a wafer processed according to an embodiment of the invention, corresponding to certain steps of the flowchart in FIG. 5.
Figure 6C:
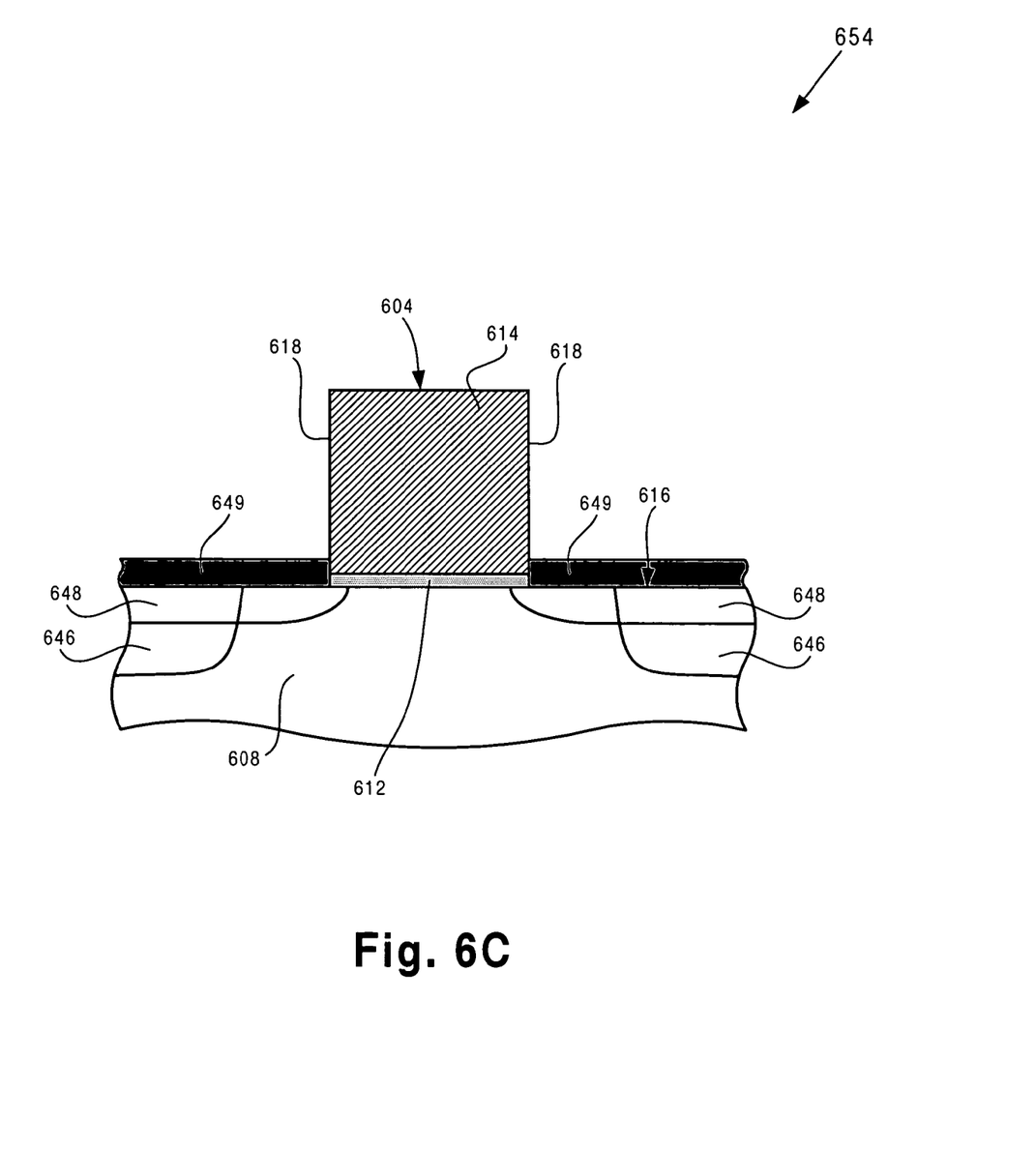
FIG. 6C illustrates a cross-sectional view of a portion of a wafer processed according to an embodiment of the invention, corresponding to certain steps of the flowchart in FIG. 5.

Referring now to step 552 in FIG. 5 and structure 652 in FIG. 6B, at step 552 of flowchart 500, disposable spacers 644 are formed adjacent to gate stack 604 and on substrate 608 and source and drain regions 646 are formed in substrate 608 adjacent to disposable spacers 644. As shown in FIG. 6B, disposable spacers 644 include oxide liner portion 643, which is situated adjacent to sidewall regions 618 of gate stack 604 and on top surface 616 of substrate 608, and nitride layer portion 645, which is situated on oxide liner portion 643. Disposable spacers 644 can be formed by utilizing an anisotropic etch process to etch liner 640 and nitride layer 642 in FIG. 6A. Also shown in FIG. 6B, source and drain regions 646 are situated in substrate 608 adjacent to disposable spacers 644. Source and drain regions 646 are heavily doped regions, which can be formed by using a deep ion implantation process using a high ion dose. Referring to FIG. 6B, the result of step 552 of flowchart 500 is illustrated by structure 652.

Referring now to step 554 in FIG. 5 and structure 654 in FIG. 6C, at step 554 of flowchart 500, disposable spacers 644 are removed, extension regions 648 are formed in substrate 608 adjacent to gate stack 604, and silicide layer 649 is formed on substrate 608 over extension regions 648 and source drain regions 646. Disposable spacers 644 in FIG. 6B can be removed by using a dry etch process, such as an $O_2$ plasma strip, which has a very high selectivity with respect to silicon. Since disposable spacers 644 in FIG. 6B include liner portion 643, which comprises amorphous carbon, the removal of disposable spacers 644 in the $O_2$ plasma strip causes disposable spacers 644 to "lift off" from top surface 616 of substrate 608 and sidewall regions 618 of gate stack 604 while causing substantially no gouging or dopant loss in extension regions 648 of substrate 408 situated below disposable spacers 644. Thus, the embodiment of present invention in FIG. 5 achieves similar advantages as the embodiments of the present invention in FIGS. 1 and 3 discussed above.

Also shown in FIG. 6C, extension regions 648 are situated in substrate 608 adjacent to gate stack 604 and are substantially similar in composition and formation to extension regions 206 in FIG. 2A. In one embodiment, extension regions 648 can be formed in substrate 608 prior to deposition of liner 640 and nitride layer 642 in FIG. 6A. Further shown in FIG. 6C, silicide layer 649 is situated on substrate 608 over extension regions 648 and source and drain regions 646. Silicide layer 649 can be formed in a similar manner and provides similar advantages as silicide layer 220 in FIG. 2B. Referring to FIG. 6C, the result of step 554 of flowchart 500 is illustrated by structure 654.

Thus, in the embodiments of the present invention in FIGS. 1, 3, and 5, by utilizing amorphous carbon in the formation of disposable spacers, the present invention advantageously achieves disposable spacers that can be removed while causing substantially no gouging or dopant loss in the substrate situated below the disposable spacers. Additionally, the present invention's disposable spacer process does not require an oxide liner as required in a conventional disposable spacer process.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, disposable spacer process for field effect transistor fabrication has been described.

The invention claimed is:

1. A method for forming a field effect transistor on a substrate, said method comprising steps of:
    forming extension regions in said substrate adjacent to a gate stack;
    forming disposable spacers adjacent to said gate stack situated on said substrate, said disposable spacers comprising amorphous carbon, said disposable spacers being formed after forming said extension regions;
    forming source and drain regions in said substrate, said source and drain regions being situated adjacent to said disposable spacers;
    removing said disposable spacers;
    wherein said step of removing said disposable spacers causes substantially no gouging in said substrate.

2. The method of claim 1 wherein said step of removing said disposable spacers comprises using a dry etch process.

3. The method of claim 1 further comprising a step of forming a silicide layer on said substrate, said silicide layer being situated adjacent to said gate stack.

4. The method of claim 1 wherein said disposable spacers have a width of approximately 70.0 Angstroms.

5. The method of claim 1 wherein said step of forming said disposable spacers comprises steps of:
    depositing a layer of amorphous carbon on said gate stack and on said substrate adjacent to said gate stack;
    anisotropically etching said layer of amorphous carbon.

6. The method of claim 2 wherein said dry etch process comprises an oxygen plasma strip.

7. A method for forming a field effect transistor on a substrate, said method comprising steps of:
    forming extension regions in said substrate adjacent to a gate stack;
    forming disposable spacers adjacent to said gate stack situated on said substrate, said disposable spacers comprising amorphous carbon, said disposable spacers having a width of approximately 70.0 Angstroms;
    forming source and drain regions in said substrate, said source and drain regions being situated adjacent to said disposable spacers;
    removing said disposable spacers;
    wherein said step of removing said disposable spacers causes substantially no gouging in said substrate.

* * * * *